United States Patent [19]
Dannenberg

[11] Patent Number: 5,843,360
[45] Date of Patent: Dec. 1, 1998

[54] METHOD AND PELLET FOR ENCAPSULATING LEAD FRAMES

[75] Inventor: Johannes Lambertus Martinus Dannenberg, Zevenaar, Netherlands

[73] Assignee: Fico B.V., Didam, Netherlands

[21] Appl. No.: 666,466

[22] Filed: Jun. 21, 1996

[30] Foreign Application Priority Data

Dec. 24, 1993 [NL] Netherlands ............... 93.02265

[51] Int. Cl.$^6$ ............ B29C 31/06; B29C 45/02
[52] U.S. Cl. ............ 264/272.14; 264/272.14; 264/328.4; 264/328.5; 428/68
[58] Field of Search ............ 264/272.11, 272.17, 264/328.4, 328.5, 272.14; 425/544, DIG. 228, 116; 428/68, 76

[56] References Cited

U.S. PATENT DOCUMENTS

| | | | |
|---|---|---|---|
| 2,338,607 | 1/1944 | Wacker | 264/328.5 |
| 4,511,317 | 4/1985 | Bandoh | 264/272.17 |
| 5,043,199 | 8/1991 | Kubota et al. | 428/76 |
| 5,061,542 | 10/1991 | Brace | 264/328.5 |
| 5,098,626 | 3/1992 | Pas | 264/272.17 |
| 5,431,854 | 7/1995 | Pas | 264/328.5 |
| 5,496,509 | 3/1996 | Yamamoto et al. | 264/328.5 |

FOREIGN PATENT DOCUMENTS

WO 93 14920  8/1993  WIPO ............ B29C 45/46

OTHER PUBLICATIONS

Patent Abstracts of Japan, vol. 016, No. 275 (E–1219) Jun. 19, 1992 & JP,A,04 067 639 (NEC KYUSHU LTD) Mar. 3, 1992.

*Primary Examiner*—Angela Ortiz
*Attorney, Agent, or Firm*—Webb Ziesenheim Bruening Logsdon Orkin & Hanson, P.C.

[57] ABSTRACT

A method and pellet for encapsulating lead frames. Prior to applying pressure to a pellet, a plastic foil is placed between the pellet and a plunger. The pellet has a body of encapsulating material (e.g. epoxy) and a plastic layer connected thereto. A device is described for manufacturing such a pellet.

19 Claims, 6 Drawing Sheets

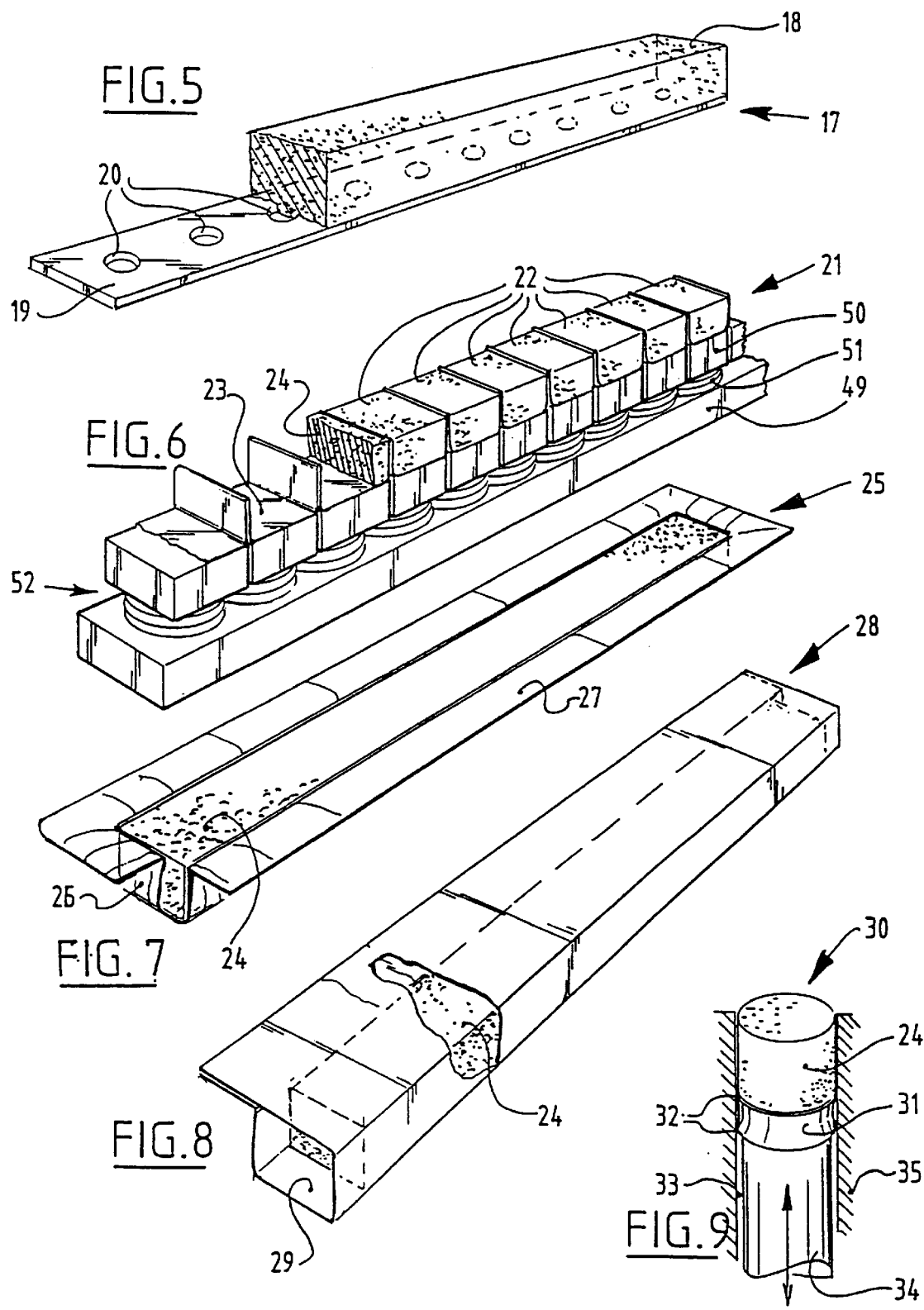

METHOD AND PELLET FOR ENCAPSULATING LEAD FRAMES

BACKGROUND OF THE INVENTION

The invention relates to a method for encapsulating lead frames by exerting pressure on a body of encapsulating material and supplying heat such that the encapsulating material becomes plastically deformable and transportable to a mould cavity, wherein the pressure is exerted by a plunger.

SUMMARY OF THE INVENTION

The invention further relates to a pellet for encapsulating lead frames and a device for manufacturing such pellets. Understood here by "pellet" is a body of encapsulating material.

On a central part of a lead-frame intended for this purpose is mounted a chip and the connecting points of the chip are connected with thin wires to the strip-like leads of the frame. Thereafter the leads and the wiring are encapsulated with a protective material in a moulding apparatus. In such moulding apparatus units of encapsulating material are used which become plastic under temperature and pressure and are supplied in this state to the lead frame which is situated in a mould cavity. A body of encapsulating material is carried for this purpose into a space which communicates with at least one mould cavity by means of at least one feed runner. The space is provided with heating means and at least one plunger for exerting pressure. The environment in which moulding takes place must be very clean. A drawback to the existing method and pellets is the fouling of the plunger and walls along which the plunger is moved (for instance a cylinder wall) by the plastic encapsulating material. Very close fitting of the plunger, which is expensive, is therefore required without this being able to prevent all problems. The plunger, the walls along which the plunger is moved and the feed runner to the mould cavity are susceptible to wear due to the action of the plastic encapsulating material. Another drawback to the pellets is the great vulnerability thereof. During transport and placing in the die the pellets can very easily be damaged which, in addition to problems during moulding, can also cause fouling in the clean environment.

The invention has for its object to provide an improved method and improved pellets for encapsulating lead frames wherein the above stated drawbacks do not occur.

The invention provides for this purpose a method in which prior to pressing, a plastic foil is placed between the encapsulating material and the plunger. The foil forms a sealing of the space between the plunger and the walls along which the plunger is movable. Thus can be prevented that plastic encapsulating material penetrates between the plunger and the walls. The invention further provides a pellet characterized by a plastic layer connected to the body of encapsulating material. With this step the sealing layer is integrated with the pellet which, in addition to the above stated advantages, makes the pellet less vulnerable. The invention moreover provides a device for manufacturing a pellet characterized by an enclosed space, means in the space for opening a vessel and a plastic bag situated in the vessel, a buffer space for powder-form encapsulating material, a feed device for plastic foil material, a die connecting onto the feed device and the buffer space, means for applying pressure in the die and ejector means co-acting with the die. Using such a device it is possible to manufacture the above stated pellets without labour-time being required therefor and without fouling the environment.

The method is preferably characterized in that the plastic foil is a layer connected to the encapsulating material. In this manner both the layer and the encapsulating material can be placed in one operation in the correct position relative to each other in the die.

The plastic layer of the pellet is preferably manufactured from a stiff material. The pellets hereby acquire an additional sturdiness.

The plastic layer is preferably a strip, which strip is preferably profiled. The pellet and the plastic layer preferably have an elongate form. Using this step it is possible to manufacture a pellet with a firm connection between the encapsulating material and the plastic layer. The elongate form of the pellet moreover provides the option of providing a plurality of mould cavities with encapsulating material with an equal pressure in all separate mould cavities.

A preferred embodiment of the pellet is characterized in that the plastic layer comprises overhanging portions. Due to these overhanging portions it is possible to apply different segments of encapsulating material onto a single strip.

Yet another preferred embodiment is characterized in that the layer has edges overhanging transversely of the lengthwise direction. Due to these overhanging edges a particularly good sealing is realized.

BRIEF DESCRIPTION OF THE DRAWING

The invention will be further described with reference to the non-limitative embodiments shown in the annexed figures. Herein:

FIG. 5 shows a perspective view of a pellet with a stiff plastic layer according to the invention;

FIG. 6 shows a perspective view of a pellet according to the invention with encapsulating material sub-divided into segments;

FIG. 7 shows a pellet with a flexible plastic layer according to the invention;

FIG. 8 shows an alternative of the pellet with flexible plastic layer shown in FIG. 7;

FIG. 9 shows a cylindrical pellet with plastic layer; and

DESCRIPTION OF THE PREFERRED EMBODIMENTS

Figure 1:
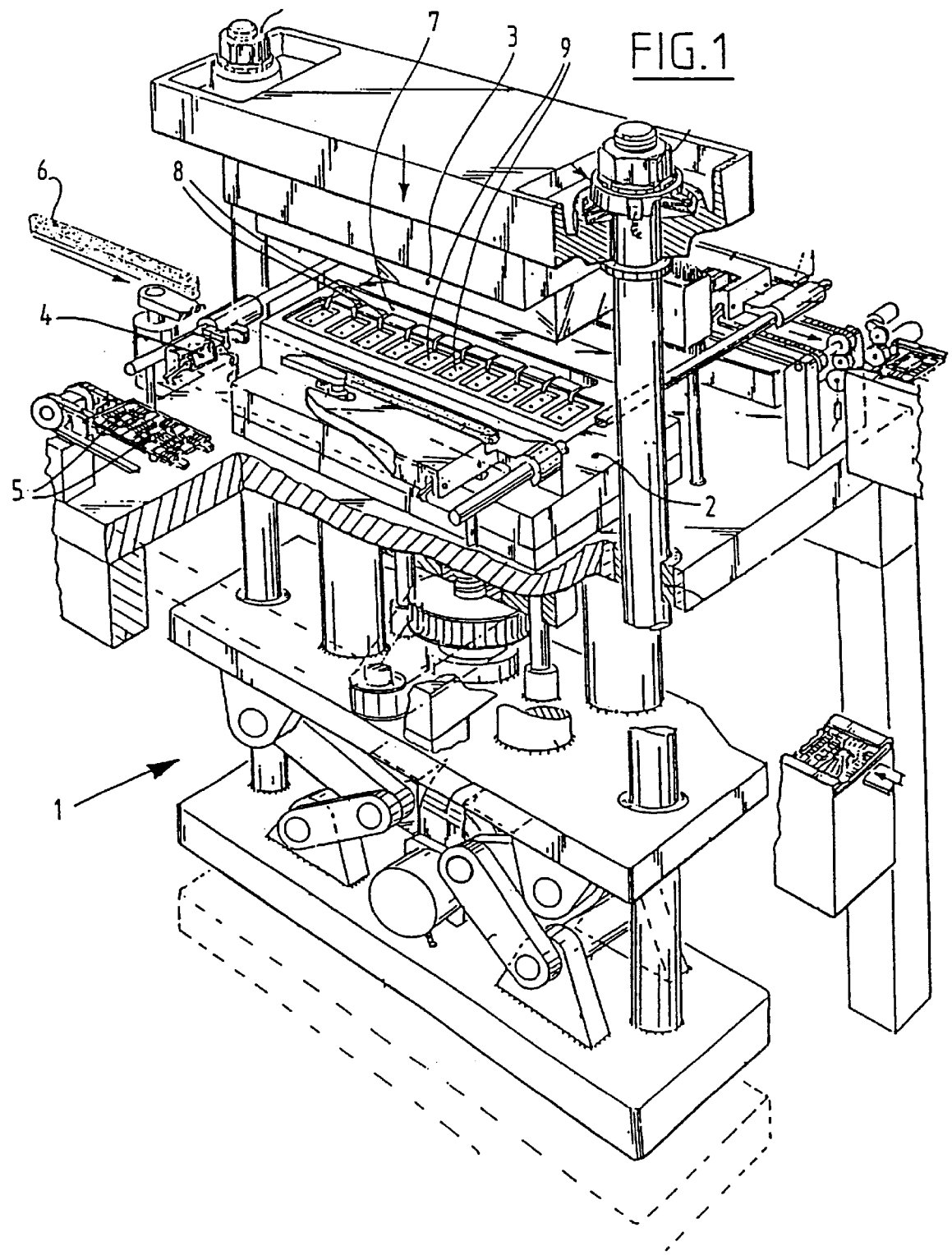
FIG. 1 shows a perspective view of a moulding apparatus.

A moulding apparatus 1 shown in FIG. 1 comprises interalia a lower mould half 2 and an upper mould half 3 movable relative thereto. A feed carriage 4 supplies lead frames 5. In addition, elongate pellets 6 of encapsulating material are fed to the moulding apparatus. The lower mould half 2 is provided with an elongate aperture 7 for receiving a pellet 6. The elongate aperture 7 is connected by means of channels 8 to cavities 9 in which the lead frames 5 can be placed.

Figure 2:
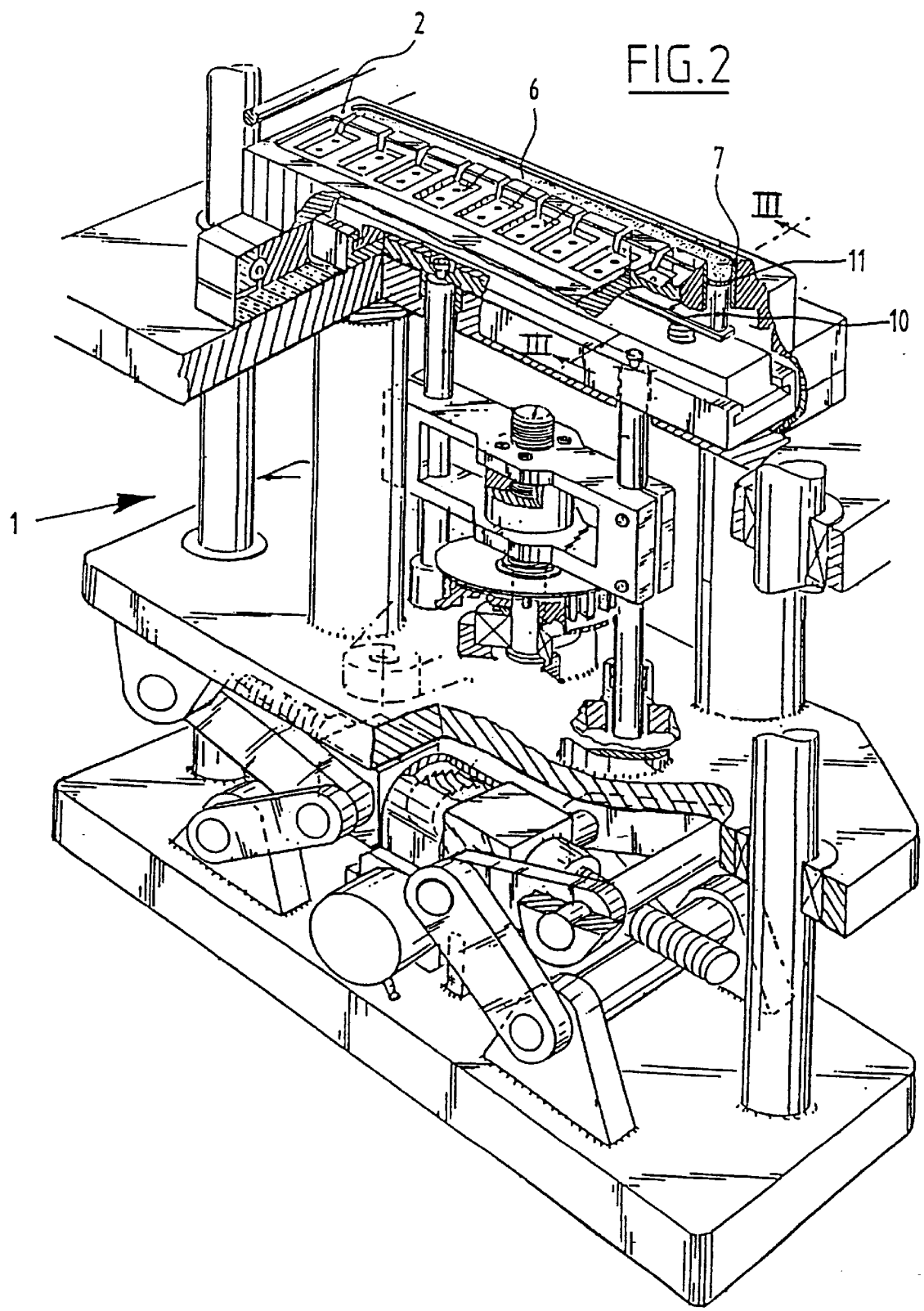
FIG. 2 shows on larger scale a detail of the bottom part of the moulding apparatus of FIG. 1.

As seen in FIG. 2, the lower mould half 2 is provided with an elongate plunger 10 corresponding in shape with the elongate aperture 7. In the situation depicted in this figure a pellet 6 is placed in the elongate aperture 7. Likewise shown is that a plastic foil 11 is received between pellet 6 and plunger 10. Plastic foil 11 thus forms a sealing of the space between plunger 10 and the walls of elongate aperture 7.

Figure 3:
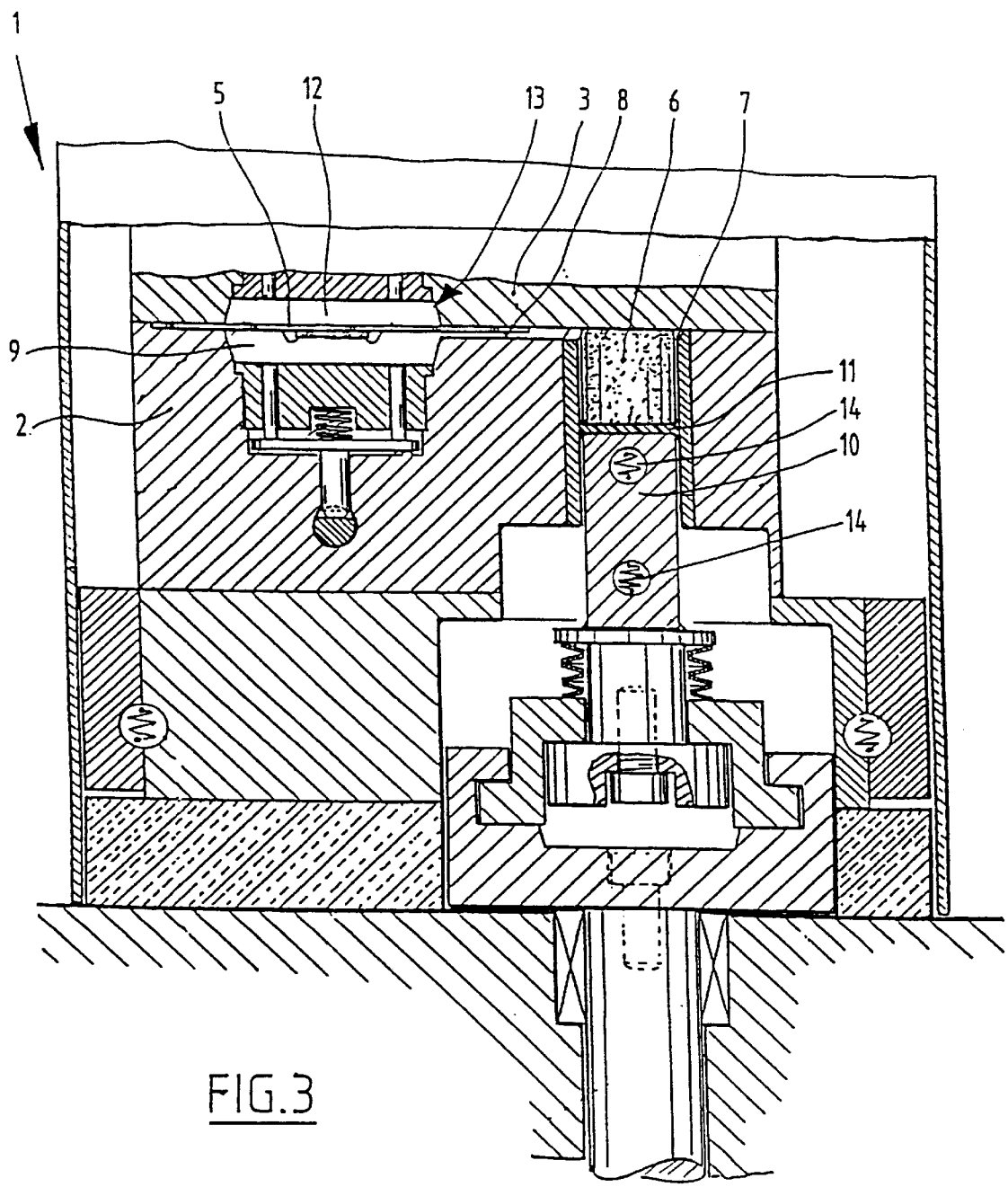
FIG. 3 is a sectional view of the form of the moulding apparatus of FIG. 1 and 2 prior to moulding of lead frames.

FIG. 3 shows a partial cross section of the lower part of the moulding apparatus 1 shown in FIG. 2. The situation illustrated here shows the two mould halves 2, 3 in closed position. The cavity 9 in the lower mould half 2 herein lies below a cavity 12 in the upper mould half 3. The two cavities 9, 12 together form a mould cavity 13 in which the lead frame 5 is placed. The mould cavity 13 is connected by means of channel 8 to the elongate aperture 7 in which is situated a pellet 6 which is not yet plastic. A plastic foil 11 is arranged between pellet 6 and plunger 10. Heating elements 14 are arranged in plunger 10 for supplying heat to pellet 6.

Figure 4:
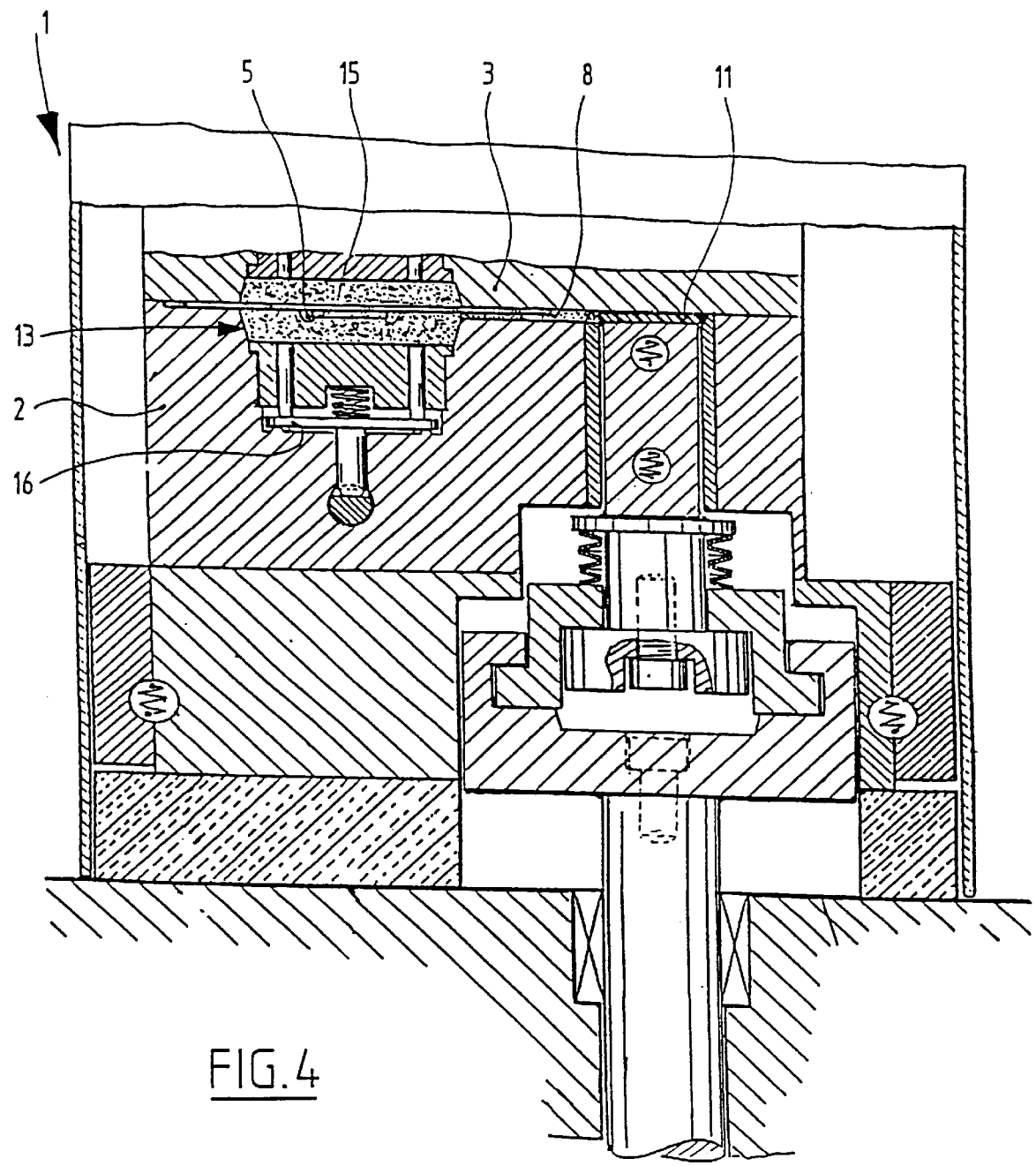
FIG. 4 is a sectional view of the form of the moulding apparatus of FIG. 3 after moulding of lead frames.

FIG. 4 shows the same cross section as that shown in FIG. 3 after moulding of lead frame 5. The mould cavity 13 is now wholly filled with an encapsulation 15. The channel 8 is also wholly filled with encapsulating material. This latter can consist for instance of a resin such as epoxy. The foil layer 11 is situated in the most favourable situation (optimum use of material) at the top against the upper mould half 3. The moulded lead frame 5 with the material joined thereto which is situated in the channel 8 and the foil layer 11 can now be removed from the die by means of an ejector 16 as soon as the two mould halves 2, 3 are moved apart.

FIG. 5 shows a pellet 17 wherein encapsulating material 18 is connected to a form-retaining strip 19. This strip is provided with a profiling 20 enabling a firm connection of the encapsulating material 18 to strip 19. As shown in the foregoing figures the strip 19 forms a seal on the plunger side during moulding of lead frames 5. An additional advantage of strip 19 is an increased sturdiness of pellet 17. This can be transported comparatively easily with little danger of damage. Strip 19 can be made for instance of a stiff plastic. Due to the fixed connection of the encapsulating material 18 to strip 19 the whole is simple to place in a die.

In the case of the pellet 21 shown in FIG. 6 the encapsulating material 24 is sub-divided into different sections 22. These latter are mutually. separated by a plastic foil 23 likewise situated on the underside. With a plunger 52 co-acting with this pellet 21 it is possible to exactly control the desired quantity of encapsulating material 24 at mould cavity 13. The sections 22 are each actuated individually with plunger elements 50. Each plunger element 50 is connected with a spring 51 to a central plunger beam 49. The thus resulting plunger 52 makes it possible to apply the same pressure to all sections.

FIG. 7 shows a pellet 25 wherein the encapsulating material 24 is covered on five sides by a foil layer 26. The latter comprises an overhanging edge 27. The overhanging edge 27 can be placed between the mould halves 2, 3 whereby the danger of leakage along the plunger 10 is limited still further. Another advantage of this embodiment is that the bottoms of channels 8 are covered, whereby they will be less subject to wear.

FIG. 8 shows a pellet 28 wherein the top side of encapsulating material 24 is also covered by a foil layer 29. This pellet 28 can only be applied when channels 8 are all situated on one side of pellet 28 (for instance the situation as shown in FIG. 1–4). This pellet 28 limits the fouling and wear of the upper mould half 3 in addition to the already stated advantages of the previously shown embodiments.

The cylindrical pellet 30 shown in FIG. 9 consists of encapsulating material 24 and a plastic carrier 31 connected thereto. The plastic carrier 31 comprises sealing edges 32 in order to effect a good sealing of a space 33 between a plunger 34 and a cylindrical plunger housing 35. Plastic encapsulating material 24 is thus prevented from penetrating into the space 33 without a very expensive, accurate fitting between plunger 34 and cylindrical plunger housing 35 being required.

Figure 10:
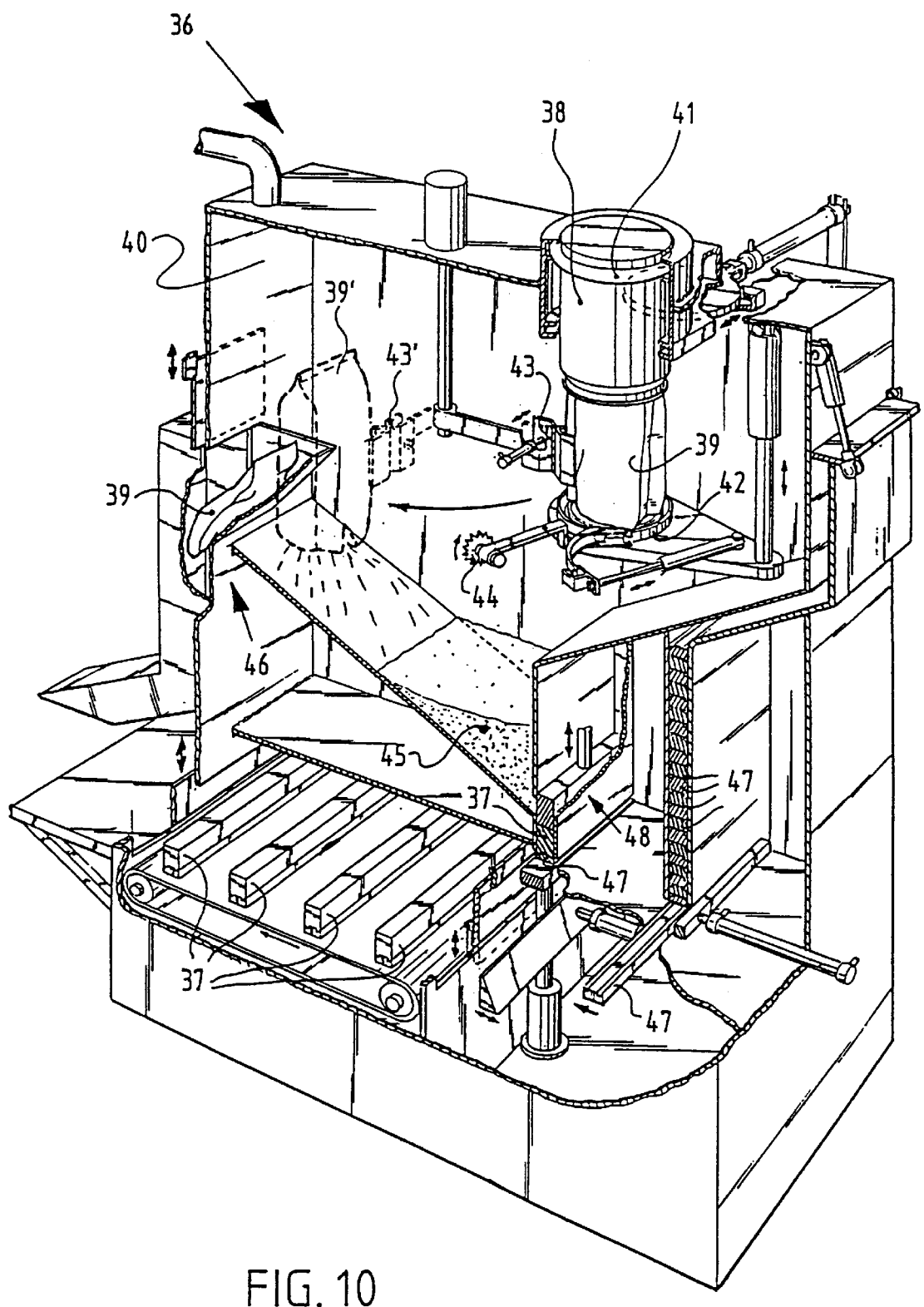
FIG. 10 shows a device for manufacturing pellets according to the invention.

Finally, FIG. 10 shows an embodiment of a device 36 for manufacturing pellets 37. The powder-form resin 45 supplied in a vessel 38 with plastic inner bag 39 is removed from the packaging in an enclosed space 40 in order to prevent dust-formation in a clean production environment. Device 36 is provided with sealing means 41 to prevent dust escaping from the enclosed space 40. Device 36 can thus be directly coupled to the above described moulding apparatus 1 functioning in a clean environment. Device 36 further comprises cover removing means 42, clamping means 43 for gripping the plastic inner bag 39 and cutting means 44 for opening bag 39. The resin 45 then falls downward and the empty inner bag 43 is discharged via an air lock 46. Profiled strips 47 are fed in below the enclosed space 40. From the powdery resin 45 and a profiled strip 47 a pellet 37 is manufactured in a pressing device 48 which can then be discharged.

I claim:

1. A method for encapsulating lead frames in a moulding apparatus having an aperture, a plurality of mould cavities defined by two mould halves extending in a longitudinal direction, a plunger, and an ejector, wherein the aperture is in flow communication with the plurality of mould cavities, comprising the steps of:

provatialing an unsealed body of encapsulating material for receipt by the moulding apparatus, said unsealed body of encapsulating material having a plastic layer located on at least one surface of the body of encapsulating material, the plastic layer configured such that at least a portion of one surface of the body of encapsulating material is uncovered;

placing the body of encapsulating material in the aperture in the moulding apparatus such that the at least one uncovered portion of one surface of the body of encapsulating material is in flow communication with the plurality of mould cavities;

placing the lead frames in each of the plurality of mould cavities;

exerting pressure on the body of encapsulating material with the plunger contacting the at least one surface having the plastic layer;

supplying heat to the body of encapsulating material such that the encapsulating material becomes plastically deformable and transportable to the plurality of mould cavities of the moulding apparatus; and encapsulating the lead frames with the ecapsulating material such that a moulded lead frame is formed in each of the plurality of cavities.

2. The method as claimed in claim 1 wherein the plastic layer is joined to the encapsulating material.

3. A pellet for encapsulating lead frames for receipt by a moulding apparatus having an aperture and a plurality of mould cavities extending in a longitudinal direction, wherein the aperture is in flow communication with the plurality of mould cavities through at least one injection channel, comprising:

an unsealed body of encapsulating material which by applying pressure and supplying heat in the moulding apparatus is plastically deformable; and a plastic layer located on at least one surface of the body of encapsulating material, the plastic layer configured such that at least one portion of a surface of the body of encapsulating material is uncovered, wherein the body of encapsulating material and the plastic layer are configured to be positioned within the aperture of the moulding apparatus such that the at least one uncovered surface of the body of encapsulating material is in flow communication with the plurality of mould cavities.

4. The pellet as claimed in claim 3, wherein the plastic layer is a form-retaining strip made of a stiff plastic.

5. The pellet as claimed in claim 4, wherein the form-retaining strip has an elongate form.

6. The pellet as claimed in claim 4, wherein the form-retaining strip includes profiling, the profiling enabling a firm connection between the body of encapsulating material and the form-retaining strip.

7. The pellet as claimed in claim 3, wherein the pellet and the plastic layer have an elongate form.

8. The pellet as claimed in claim 3, wherein the plastic layer includes at least one overhanging portion, the at least one overhanging portion configured to be received within the at least one injection channel when the body of encapsulating material is placed in the aperture in the moulding apparatus.

9. The pellet as claimed in claim 3, wherein the plastic layer includes a plurality of overhanging edges, the plurality of overhanging edges having at least one edge overhanging transversely of a lengthwise direction of the pellet, the at least one transversely overhanging edge configured to be received in the at least one injection channel when the body encapsulating material is placed in the aperture in the moulding apparatus.

10. The pellet as claimed in claim 3, wherein the plastic layer is a plastic foil layer.

11. The pellet as claimed in claim 10, wherein the plastic foil layer has an elongate form.

12. The pellet as claimed in claim 5, wherein the form-retaining strip includes profiling, the profiled retaining strip defining holes that coact with the body of encapsulating material, the profiling enabling a firm connection between the body of encapsulating material and the form-retaining strip.

13. The pellet as claimed in claim 10, wherein the pellet and the plastic foil layer have an elongate form.

14. The pellet as claimed in claim 10, wherein the plastic foil layer includes at least one overhanging portion, the at least one overhanging portion configured to be received within the at least one injection channel when the body of encapsulating material is placed in the aperture in the moulding apparatus.

15. The pellet as claimed in claim 3, wherein the body of encapsulating material is divided into a plurality of sections, each of the sections separated by the plastic layer.

16. The pellet as claimed in claim 15, wherein the pellet and the plastic layer have an elongate form.

17. The pellet as claimed in claim 10, wherein the plastic foil layer includes a plurality of overhanging edges, the plurality of overhanging edges having at least one edge overhanging transversely of a lengthwise direction of the pellet, the at least one transversely overhanging edge configured to be received in the at least one injection channel when the body of encapsulating material is placed in the aperture in the moulding apparatus.

18. The pellet as claimed in claim 8, wherein the at least one overhanging portion includes a first portion and a second portion spaced apart from the first portion, said first portion and second portion defining a channel therebetween.

19. The method as claimed in claim 1, further comprising the step of ejecting the plastic layer from the aperture in the moulding apparatus with the ejector after encapsulating the lead frames with the encapsulating material.

* * * * *